(12) United States Patent
Yeh et al.

(10) Patent No.: US 7,535,630 B2
(45) Date of Patent: May 19, 2009

(54) BROADBAND HYBRID TWO-STAGE OPTICAL AMPLIFIER

(75) Inventors: Chien-Hung Yeh, Jhudong Township, Hsinchu County (TW); Sien Chi, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/545,508

(22) Filed: Oct. 11, 2006

(65) Prior Publication Data

US 2007/0285765 A1 Dec. 13, 2007

Related U.S. Application Data

(60) Provisional application No. 60/811,781, filed on Jun. 8, 2006.

(51) Int. Cl.
*H01S 3/00* (2006.01)

(52) U.S. Cl. .................. 359/337.4; 359/341.1

(58) Field of Classification Search .............. 359/337.4, 359/337.1, 337.11, 341.1
See application file for complete search history.

(56) References Cited

U.S. PATENT DOCUMENTS

| | | | | |
|---|---|---|---|---|
| 5,673,141 | A * | 9/1997 | Gambini | 359/341.1 |
| 5,861,970 | A * | 1/1999 | Tatham et al. | 398/150 |
| 6,043,931 | A * | 3/2000 | Jourdan et al. | 359/344 |
| 6,236,498 | B1 | 5/2001 | Freeman et al. | |
| 6,388,806 | B1 | 5/2002 | Freeman et al. | |
| 6,408,121 | B1 | 6/2002 | Goto | |
| 6,462,863 | B1 * | 10/2002 | Atieh et al. | 359/337.5 |
| 6,490,077 | B1 * | 12/2002 | Conradi | 359/334 |
| 6,603,593 | B2 | 8/2003 | Fidric et al. | |
| 6,778,320 | B1 * | 8/2004 | Traynor | 359/334 |
| 6,825,972 | B2 | 11/2004 | Emori et al. | |
| 7,012,742 | B2 * | 3/2006 | Lee et al. | 359/334 |
| 2002/0041432 | A1 | 4/2002 | Onaka et al. | |
| 2002/0191902 | A1 | 12/2002 | Gao | |
| 2002/0191926 | A1 | 12/2002 | Gao | |
| 2003/0133181 | A1 | 7/2003 | Gao | |
| 2003/0165007 | A1 | 9/2003 | Frolov et al. | |
| 2003/0184851 | A1 | 10/2003 | Tian et al. | |
| 2003/0202770 | A1 | 10/2003 | Garito et al. | |
| 2003/0234978 | A1 | 12/2003 | Garito et al. | |
| 2004/0136681 | A1 | 7/2004 | Drewery et al. | |

(Continued)

OTHER PUBLICATIONS

M. Yamada et al., "Fluoride-Based Erbium-Doped Fiber Amplifier with Inherently Flat Gain Spectrum," IEEE Photonics Technology Letters, vol. 8, No. 7, pp. 882-884, Jul. 1996.

(Continued)

*Primary Examiner*—Mark Hellner
(74) *Attorney, Agent, or Firm*—Finnegan, Henderson, Farabow, Garrett & Dunner LLP

(57) ABSTRACT

An optical amplifier is disclosed having a relatively high gain and low noise figure across the broadband wavelength range. In an exemplary embodiment, the optical amplifier comprises an optical fiber including a core doped with a fluorescent material, the optical amplifier having an associated first noise figure. The optical amplifier also comprises a semiconductor optical amplifier portion being optically coupled to the optical fiber, the semiconductor optical amplifier portion having an associated second noise figure, wherein the first noise figure is less than the second noise figure.

17 Claims, 9 Drawing Sheets

U.S. PATENT DOCUMENTS

2007/0286559 A1    12/2007    Yeh et al.

OTHER PUBLICATIONS

M. Pandit et al., "Tunable Long-Period Fiber Gratings for EDFA Gain and ASE Equalization," Microwave and Optical Technology Letters, vol. 25, No. 3, pp. 181-184, May 5, 2000.

P. Wysocki et al., "Broad-Band Erbium-Doped Fiber Amplifier Flattened Beyond 40 nm Using Long-Period Grating Filter," IEEE Photonics Technology Letters, vol. 9, No. 10, pp. 1343-1345, Oct. 1997.

S. Liaw et al., "Dynamic Power-Equalized EDFA Module Based on Strain Tunable Fiber Bragg Gratings," IEEE Photonics Technology Letters, vol. 11, No. 7, pp. 797-799, Jul. 1999.

R. Feced et al., "Acoustooptic Attenuation Filters Based on Tapered Optical Fibers," IEEE Journal of Selected Topics in Quantum Electronics, vol. 5, No. 5, pp. 1278-1288, Sep./Oct. 1999.

S. Yun, et al., "Dynamic Erbium-Doped Fiber Amplifier based on Active Gain Flattening with Fiber Acoustooptic Tunable Filters," IEEE Photonics Technology Letters, vol. 11, No. 10, pp. 1229-1231, Oct. 1999.

J. Nilsson et al., "Simple gain-flattened erbium-doped fiber amplifier with a wide dynamic range," Opt. Fiber Communication Conference, Washington, D.C.: Optical Society of America, OSA Technical Digest, pp. 129-130, 1997.

R. Betts et al., "Split-beam Fourier filter and its application in a gain-flattened EDFA," Opt. Fiber Communication Conference, Washington, D.C.: Optical Society of America, OSA Technical Digest, pp. 80-81, 1995.

S. Li et al., "Gain Flattening of an Erbium-Doped Fiber Amplifier Using a High-Birefringence Fiber Loop Mirror," IEEE Photonics Technology Letters, vol. 13, No. 9, pp. 942-944, Sep. 2001.

J. Ania-Castanon et al., "Simple design method for gain-flattened three-pump Raman amplifiers," IEEE Leos, vol. 2, pp. 500-501, 2002.

Y. Sun et al., "80nm ultra-wideband erbium-doped silica fiber amplifier," Electronics Letters, vol. 33, No. 23, pp. 1965-1967, Nov. 6, 1997.

H. Masuda et al., "Wideband, gain-flattened, erbium-doped fibre amplifiers with 3dB bandwidths of >50nm," Electronics Letters, vol. 33, No. 12, pp. 1070-1072, Jun. 5, 1997.

B. Min et al., "Coupled Structure for Wide-Band EDFA with Gain and Noise Figure Improvements for C to L-Band ASE Injection," IEEE Photonics Technology Letters, vol. 12, No. 5, pp. 480-482, May 2000.

R. Di Muro et al., "Broad-Band Amplification Using a Novel Amplifier Topology," IEEE Photonics Technology Letters, vol. 13, No. 10, pp. 1073-1075, Oct. 2001.

S. Hwang et al., "Comparative high power conversion efficiency of C-pulse L-band EDFA," Electronics Letters, vol. 37, No. 25, pp. 1539-1541, Dec. 6, 2001.

Y. Lu et al., "All-optical gain-clamped wideband serial EDFA with ring-shaped laser," Optics Communications, vol. 229, pp. 317-323, 2004.

Q. Jiang et al., "Dynamically Gain Control in the Serial Structure C+L Wide-Band EDFA," IEEE Photonics Technology Letters, vol. 16, No. 1, pp. 87-89, Jan. 2004.

S. Harun et al., "Double-Pass L-Band EDFA with Enhanced Noise Figure Characteristics," IEEE Photonics Technology Letters, vol. 15, No. 8, pp. 1055-1057, Aug. 2003.

L. Yi et al., "Improvement of Gain and Noise Figure in Double-Pass L-Band EDFA by Incorporating a fiber Bragg Grating," IEEE Photonics Technology Letters, vol. 16, No. 4, pp. 1005-1007, Apr. 2004.

H. Choi et al., "Simple and efficient L-band erbium-doped fiber amplifiers for WDM networks," Optics Communciations, vol. 213, pp. 63-66, 2002.

S. Namiki et al., "Ultrabroad-Band Raman Amplifiers Pumped and Gain-Equalized by Wavelength-Division-Multiplexed High-Power Laser Diodes," IEEE Journal on Selected Topics in Quantum Electronics, vol. 7, No. 1, pp. 3-16, Jan./Feb. 2001.

* cited by examiner

BROADBAND HYBRID TWO-STAGE OPTICAL AMPLIFIER

CROSS-REFERENCE TO RELATED APPLICATION

This application claims the benefit of priority from U.S. Provisional Application No. 60/811,781, entitled "Wideband Hybrid Two-Stage Fiber Amplifier with 110 nm Amplification Bandwidth," filed on Jun. 8, 2006, the disclosure of which is expressly incorporated herein by reference to its entirety.

TECHNICAL FIELD

The present invention generally relates to the fields of fiber optics and the amplification of optical signals. More specifically, the invention relates to systems and methods for providing an optical amplifier capable of a wideband amplification bandwidth.

BACKGROUND INFORMATION

Optical communication systems are known which carry an optical channel of a single wavelength over one or more optical fibers. To convey information from plural sources, time-division multiplexing (TDM) is frequently employed. In TDM, a particular time slot is assigned to each signal source, and the complete signal is constructed from portions associated with each time slot. While this is a useful technique for carrying plural information sources on a single optical channel, its capacity is limited by fiber dispersion and the need to generate high peak power pulses.

Wavelength division multiplexing (WDM) has been explored as an approach for increasing the capacity of existing fiber optic networks. In a WDM system, plural optical signal channels are carried over a single optical fiber with each channel being assigned a particular wavelength. Since each optical channel itself can be time division multiplexed, the overall information carrying capacity of the fiber optic network can be increased substantially.

Optical channels in a WDM system are frequently transmitted over silica based optical fibers, which typically have relatively low loss at wavelengths within a range of 1520 to 1580 nm. WDM optical signal channels at wavelengths within this low loss "window" can be transmitted over distances of approximately 50 km without significant attenuation. For distances beyond 50 km, however, optical amplifiers are required to compensate for optical fiber loss.

Optical amplifiers have been developed which include a gain medium doped with a rare earth element, such as erbium, praseodymium, neodymium, and tellurium. The most commonly used rare earth element is erbium because it produces the greatest gain within the wavelength range of 1520 to 1580 nm. In particular, this wavelength range covers the wavelength range referred to as the conventional or C-band range, which approximately extends from 1525 to 1565 nm. The erbium doped medium is "pumped" with light at a selected wavelength, e.g., 980 nm, to provide amplification or gain at wavelengths within this low loss window of the optical fiber.

However, a shortcoming of erbium doped amplifiers is that their efficiency greatly decreases outside of the C-band range. For example, in order to further increase the bandwidth of WDM systems, optical signal transmissions in the 1565 to 1610 nm wavelength range, the so-called Long (L-band) wavelength range, and optical signal transmission in the 1450 to 1500 nm wavelength range, the so-called short (S-band) wavelength range are being combined with optical transmissions in the C-band range. However, because the L-band and S-band are far from the erbium ion absorption band, the power conversion efficiency of an erbium doped amplifier is too low to get a high gain. Therefore, in broadband WDM transmission systems, optical transmission systems that transmit optical signals that span the S-band, C-band, and L-band, erbium doped optical amplifiers prove to be inefficient.

Several methods have been previously proposed to improve the L-band gain of erbium doped amplifiers, such as applying unwanted C-band amplified spontaneous emission (ASE), using a double pass configuration, and a reflection-type erbium doped fiber amplifier with fiber grating. However, these methods have failed to produce an erbium doped amplifier capable of broadband amplification, while attaining sufficient gains and noise figure. Accordingly, there is a need for an erbium doped amplifier capable of providing sufficient gain and noise figure across the broadband wavelength range.

SUMMARY

In accordance with the principles of the present invention, as embodied and broadly described herein, methods and systems are provided for enhancing the gain and noise figure of an optical amplifier capable of a wideband amplification bandwidth.

According to one embodiment, an optical amplifier is provided that comprises an optical fiber including a core doped with a fluorescent material, the optical amplifier having an associated first noise figure. The optical amplifier also comprises a semiconductor optical amplifier portion coupled to the optical fiber, the semiconductor optical amplifier portion having an associated second noise figure, wherein the first noise figure is less than the second noise figure.

According to another embodiment, a wavelength division multiplexing transmission system is provided that comprises a plurality of transmitters configured to transmit a plurality of optical signals, wherein each of the plurality of optical signals is at a respective one of a plurality of wavelengths. The wavelength division multiplexing transmission system also includes a multiplexer configured to combine the plurality of optical signals, and an optical amplifier. The optical amplifier may comprise an optical fiber including a core doped with a fluorescent material, the optical amplifier having an associated first noise figure. The optical amplifier also comprises a semiconductor optical amplifier portion coupled to the optical fiber, the semiconductor optical amplifier portion having an associated second noise figure, wherein the first noise figure is less than the second noise figure. The wavelength division multiplexing transmission system may further comprise a demultiplexer configured to separate each of the plurality of optical signals based on their respective wavelength and a plurality of receivers configured to receive the separated optical signals and convert the optical signals into corresponding electrical signals.

According to a further embodiment, an optical amplifier is provided that comprises a semiconductor optical amplifier portion configured to impart first gain values within a first wavelength range, and second gain values outside the first wavelength range. The optical amplifier also comprises an optical fiber coupled to the semiconductor optical amplifier portion and including a core doped with a fluorescent material, the optical fiber being configured to impart third gain values within the first wavelength range, and fourth gain values outside the first wavelength range Moreover, wherein the optical amplifier is configured to impart fifth gain values outside the first wavelength range, each of the fifth gain values being greater than each of the first gain values and the third gain values.

It is to be understood that both the foregoing general description and the following detailed description are exemplary and explanatory only and are not restrictive of the invention, as described. Further features and/or variations may be provided in addition to those set forth herein. For example, the present invention may be directed to various combinations and subcombinations of the disclosed features and/or combinations and subcombinations of several further features disclosed below in the detailed description.

BRIEF DESCRIPTION OF THE DRAWINGS

The accompanying drawings show features of implementations consistent with the present invention and, together with the corresponding written description, help explain principles associated with the invention. In the drawings.

DETAILED DESCRIPTION

Reference will now be made in detail to the invention, examples of which are illustrated in the accompanying drawings. The implementations set forth in the following description do not represent all implementations consistent with the claimed invention. Instead, they are merely some examples consistent with certain aspects related to the invention. Wherever possible, the same reference numbers will be used throughout the drawings to refer to the same or like parts.

Figure 1:
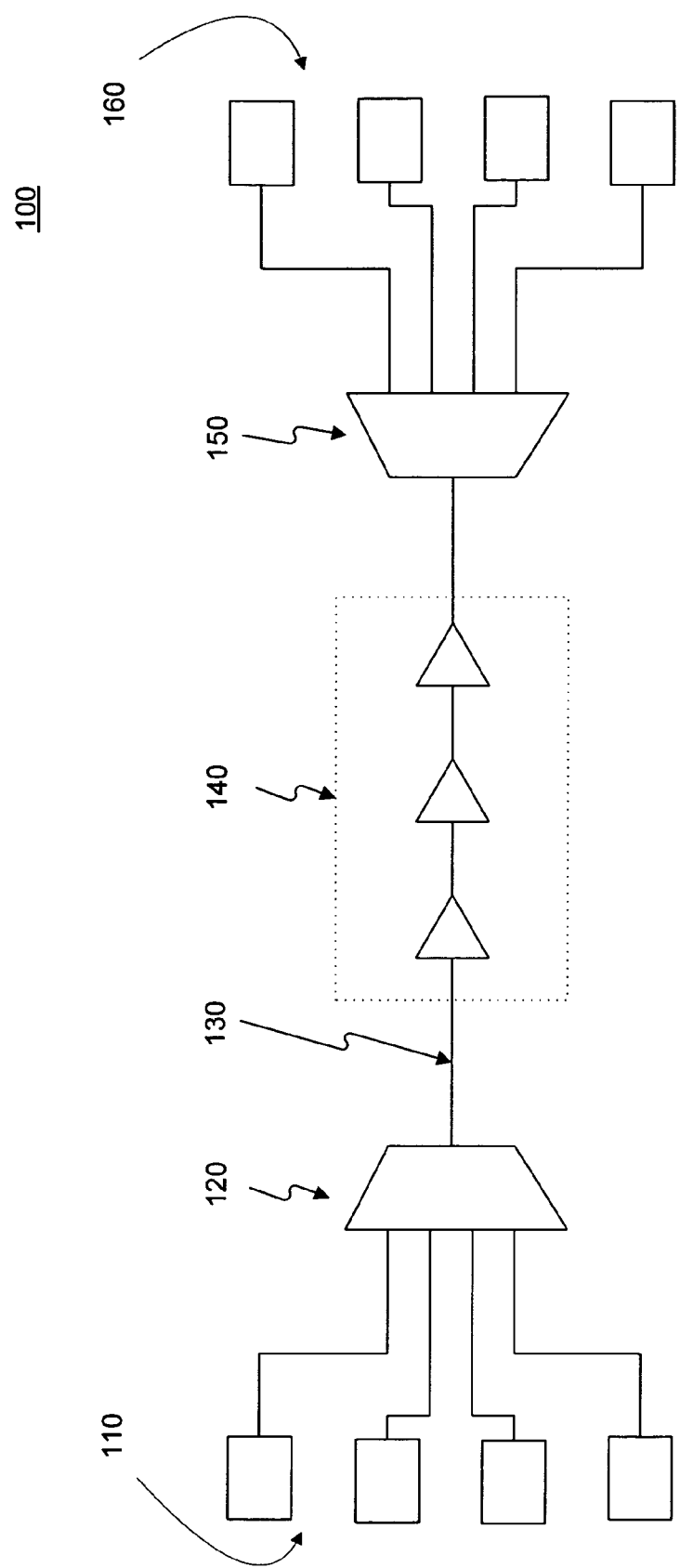
FIG. 1 illustrates a wavelength division multiplexing transmission system, consistent with an aspect of the present invention.

FIG. 1 illustrates a block diagram of an exemplary WDM transmission system 100, consistent with certain aspects related to the present invention. As shown, system 100 may include a plurality of transmitters 110, WDM multiplexer 120, optical fiber communication path 130, one or more optical amplifiers 140, a WDM demultiplexer 150, and a plurality of receivers 160. The transmission of optical signals through system 100 typically involves each of the plurality of transmitters 110 transmitting a corresponding optical signal at a different wavelength. The wavelengths may be in a range of 1500 to 1610 nm, which may encompass the S-band through the L-band. The transmitters 110 may comprise a light source, such as a light emitting diode or a laser, that may be modulated according to a binary input stream. Each optical signal output from transmitters 110 enters WDM multiplexer 120, which combines the signals and transmits the combined signal along optical fiber communication path 130. Optical fiber communication path 130 typically includes one or more segments of optical fiber.

Typically, one or more optical amplifiers 140 are provided along communication path 130 to amplify the transmitted optical signals in order to offset any losses associated with communication path 130. As described in greater detail with respect to FIG. 2, optical amplifier 140 includes two stages that provide a relatively high gain and low noise figure for a broadband transmission.

After propagating along communication path 130, the optical signals are next supplied to a known WDM demultiplexer 150, which separates the incoming signals based upon their respective wavelength. The signals output from WDM demultiplexer 150 are then supplied to corresponding receivers 160, which may comprise a photodetector capable of converting the transmitted optical signal to an electrical signal for further processing.

Figure 2:
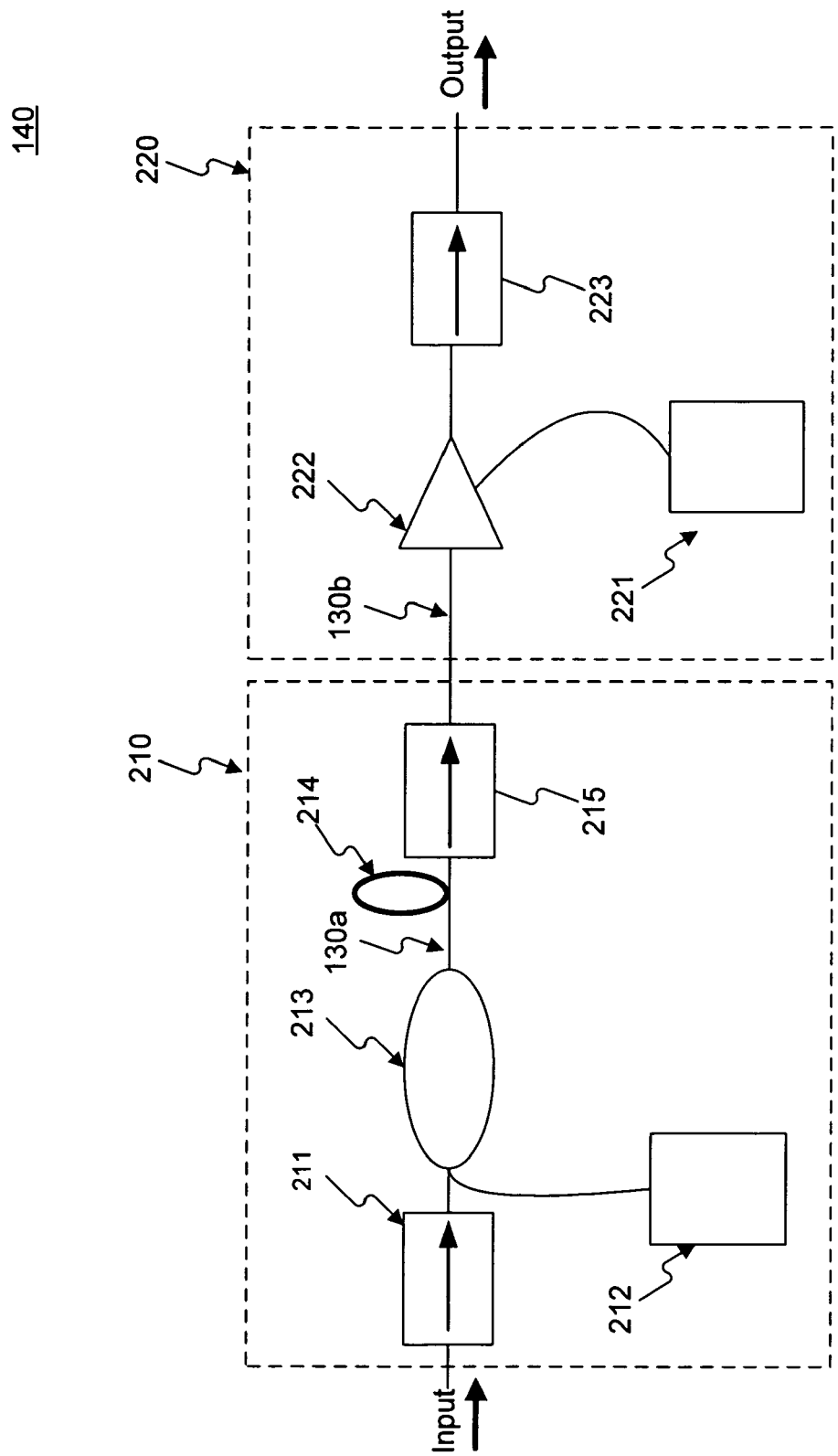
FIG. 2 illustrates a broadband hybrid two-stage optical amplifier system, consistent with an embodiment of the present invention.

FIG. 2 illustrates a block diagram of an exemplary embodiment of a two-stage optical amplifier system 140, consistent with certain aspects related to the present invention. As shown, amplifier system 140 may include a first stage 210 and a second stage 220. The first stage 210 includes an erbium doped fiber 214 and the second stage includes a semiconductor optical amplifier (SOA) portion 222. Although both the first stage 210 and the second stage 220 are capable of amplifying an optical signal, there may be differences in the manner in which the amplification is accomplished. For example, first stage 210 includes an optically pumped erbium doped fiber 214 having a length of several meters to several tens of meters in length. The second stage 220, typically utilizes SOA portion 222, which includes a gain medium having a resonant cavity, such as a Fabry-Perot cavity, that is electrically pumped with an injected current.

As further shown in FIG. 2, a WDM signal including multiple channels of optical signals, each at a different wavelength, is further supplied to an optical isolator 211 in first stage 210 of amplifier system 140. Optical isolator 211 is typically a passive device that substantially prevents return reflections along communication path 130. For example, optical isolator 211 substantially prevents amplified spontaneous emission (ASE) light generated within first stage 210 from propagating along communication path 130, portions of which may reflect the ASE light back into first stage 210 and increase noise.

After passing through optical isolator 211, the WDM signal (i.e., a first input optical signal) is combined with pump light in a known optical coupler 213, which may include a fused fiber coupler or thin film filter, for example. Optical coupler 213 is coupled to the input portion of erbium doped fiber 214 via a first optical communication path portion 130a. The pump light is typically output from an optical source 212, such as a laser or light emitting diode, and may be at a wavelength substantially equal to 980 nm, although other known pump wavelengths, such as 1480 nm may be used.

Figure 3:
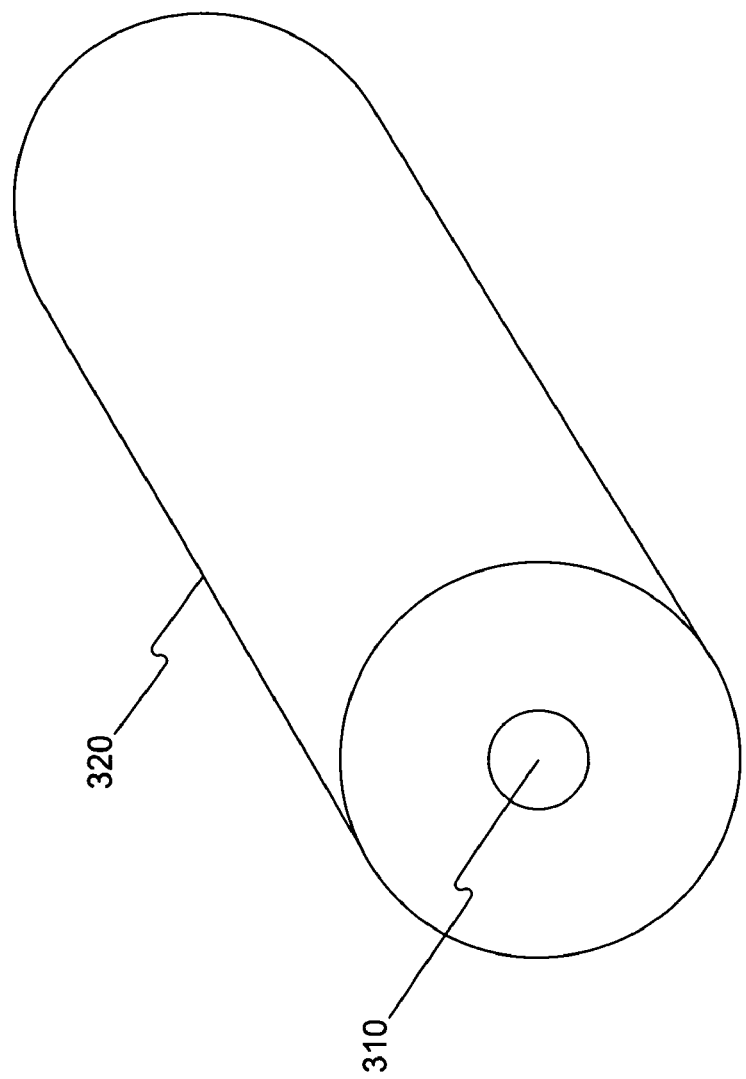
FIG. 3 illustrates an erbium doped fiber, consistent with an embodiment of the present invention.

Next, the combined pump light and WDM signal is supplied to the input portion of erbium doped fiber 214. As shown in FIG. 3, erbium doped fiber 214 includes a relatively high refractive index core 310, which is doped with erbium, and a relatively low refractive index cladding 320. Due to the refractive index difference between core 310 and cladding 320, the pump light and WDM signal remain substantially confined to the core 310. The pump light (at 980 nm or 1480 nm, for example) excites erbium atoms in region 310, and when these atoms relax to a lower energy state through stimulated emission, for example, light is emitted at one or more of the WDM signal wavelengths, thereby providing amplification to the input WDM signal. Subsequently, the amplified WDM signal is passed through optical isolator 215 before being output from first stage 210 to second stage 220.

Figure 4:
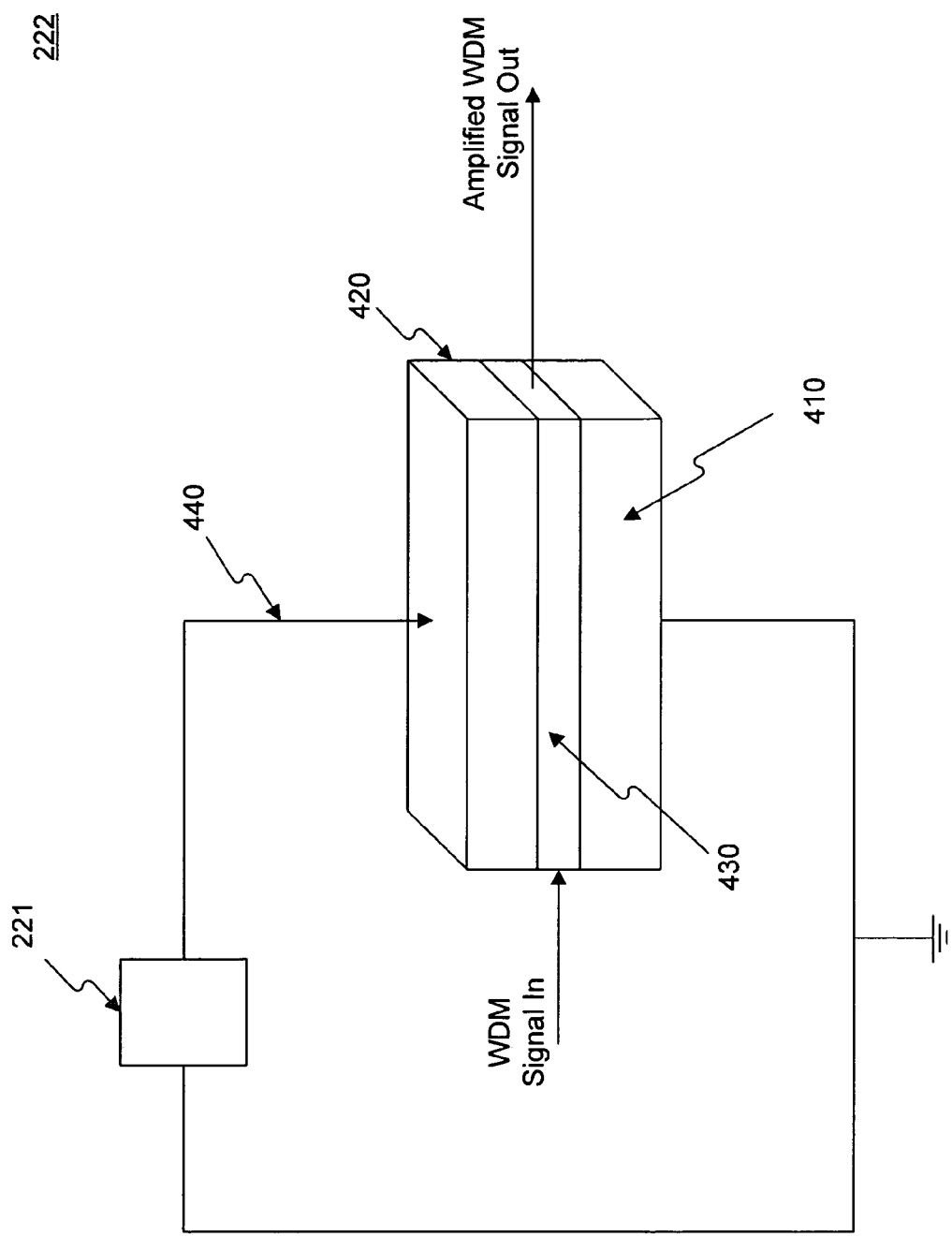
FIG. 4 illustrates a semiconductor optical amplifier, consistent with an embodiment of the present invention.

Second stage 220 may include, a current supply source 221, SOA portion 222, and an optical isolator 223. The WDM signal input to second stage 220 enters the input section of SOA portion 222 via optical communication path portion 130b. FIG. 4 illustrates a cross-sectional view of SOA portion 222. As illustrated, SOA portion 222 includes a substrate 410, antireflective coating 420, gain medium 430, and is supplied with an input current 440 from current supply source 221. In response to input current 440, SOA portion 222 imparts gain to the received WDM signal in a known manner. The amplified WDM signal output from SOA portion 222 is passed through optical isolator 223 before the WDM signal is output from the second stage 220. In an exemplary embodiment, current 440 is equal to 150 mA. In addition, a threshold current of SOA portion 222 may be 50 mA and a maximum current that can be safely applied to SOA portion 222 may be 250 mA.

Figure 5:
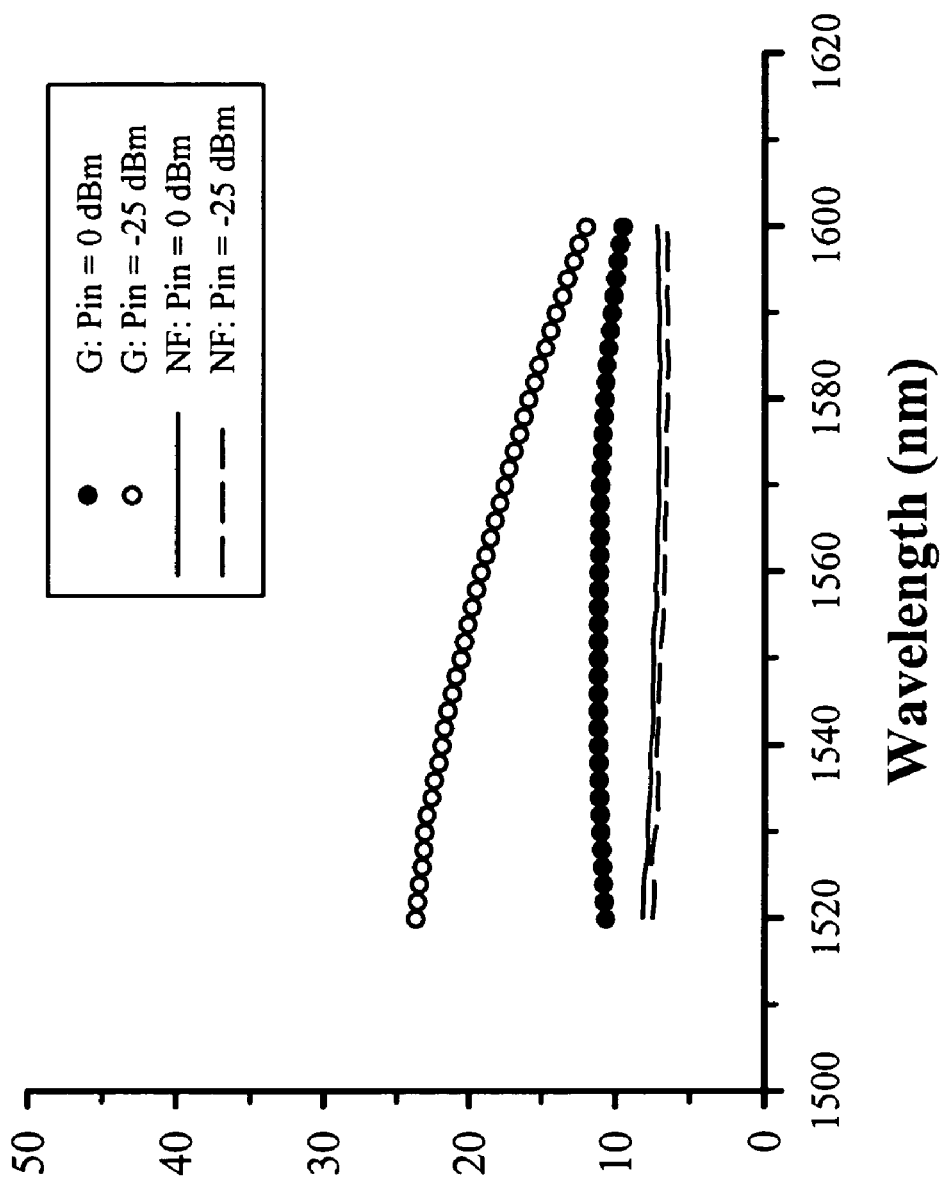
FIG. 5 illustrates a graph of gain and noise figure spectra of a semiconductor optical amplifier over a spectral range of 1520 to 1600 nm for 0 and −25 dBm input signal powers, consistent with an embodiment of the present invention.

Gain performance and noise figure spectra of an exemplary optical amplifier system 140, consistent with the present invention was measured with a tunable laser source and an optical spectrum analyzer with a 0.05 nm resolution. FIG. 5 illustrates the gain and noise figure spectra of an exemplary second stage 220 within the operating wavelength range of 1520 to 1600 nm, when the pumping current of pump current source 221 is equal to 150 mA and the input signal powers are 0 and −25 dBm, respectively. As illustrated, a gain (G) of the second stage 220 can be up to 11.1 dB for 0 dBM input signal power (Pin) at a wavelength of 1548 nm. Also, when the input signal power is −25 dBm a maximum gain of 23.6 and a noise figure (NF) of 7.5 was observed at a wavelength of 1520 nm. The noise figure spectra of the second stage 220 within the operating wavelength range of 1520 to 1600 nm, herein referred to as the "first noise figure," is within a range of 8.2 to 7.2 dB at an input signal power of 0 dBm and within a range of 7.5 to 6.6 dB at an input signal power of −25 dBm.

Figure 6:
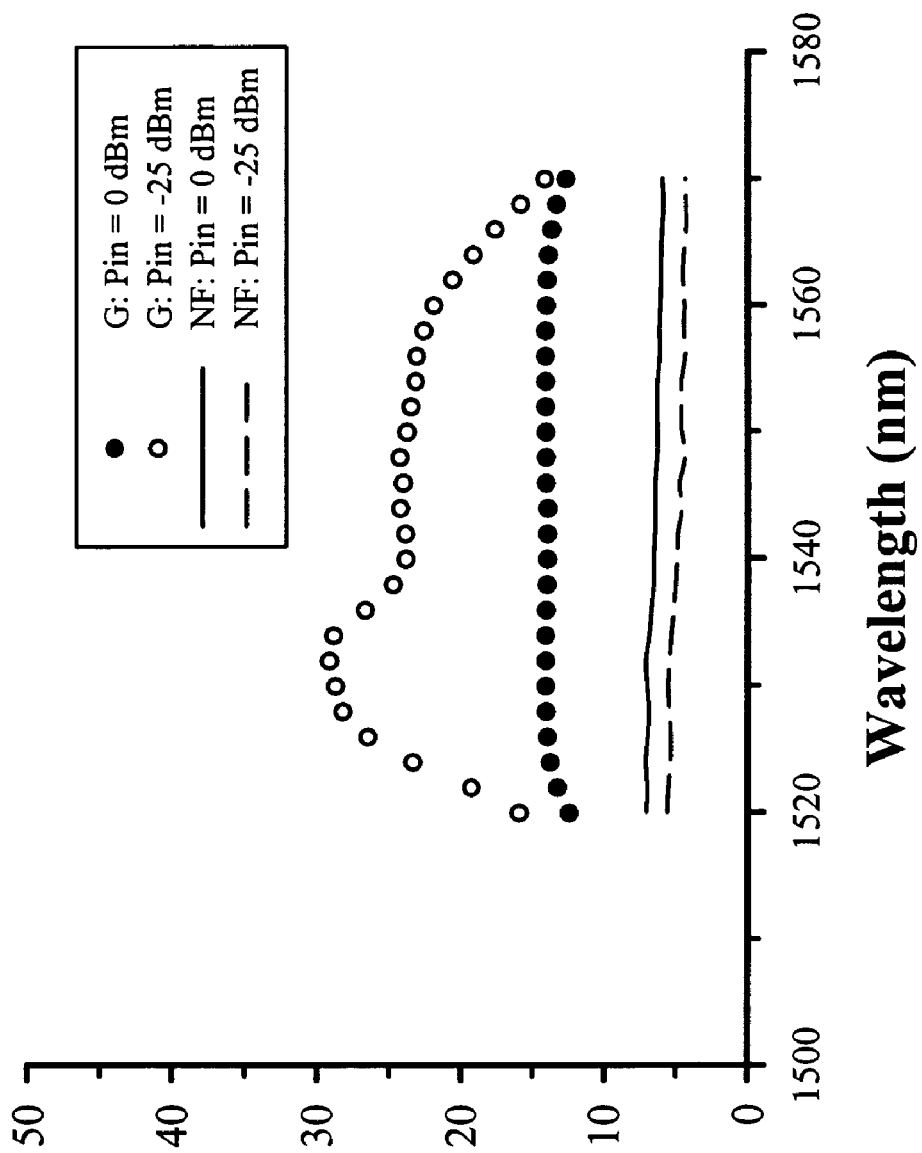
FIG. 6 illustrates a graph of gain and noise figure spectra of an erbium doped fiber amplifier with 10 meter long erbium doped fiber over a spectral range of 1520 to 1570 nm for 0 and −25 dBm input signal powers with a pump power of 60 mW, consistent with an embodiment of the present invention.

As noted by comparing FIGS. 5 and 6, second stage 220 has associated gain values or first gain values over a wavelength range e.g., the C-band range, which are less than the third gain values associated with first stage 210 over the same wavelength range. The second stage 220 also has associated gain values or second gain values outside of the wavelength range, which are also less than the fourth gain values associated with first stage 210 over the same wavelength range. In addition, second stage 220 has a higher noise figure over the C-band range, for example, than that of first stage 210. Accordingly, semiconductor optical amplifiers are often less preferred than erbium doped fiber amplifiers because higher gain and lower noise figure are generally desirable in WDM systems.

Consistent with an aspect of the present invention, first stage 210 including erbium doped fiber 214 may be provided as a pre-amplification stage to second stage 220 including SOA portion 222. However, as discussed in greater detail below with respect to FIGS. 6-8, the length of erbium doped fiber 214 may affect the output of first stage 210, as well as the output of amplifier 140.

FIG. 6 illustrates the gain and noise figure spectra of an exemplary first stage 210 for the input signal power Pin=0 and −25 dBm over a wavelength range of 1520 to 1570 nm. Here, first stage 210 includes a pump source 212 supplying pump power at 60 mW. In addition, fiber 214 has a length of 10 meters. As further shown in FIG. 6, a peak gain of 29.1 dB and a noise figure of 5.4 dB is obtained at a wavelength of 1532 nm when the input signal power is −25 dBm. FIG. 6 also illustrates that all the gain is greater than 12 dB and all the noise figure is less than 7.2 dB within the wavelength range of 1520 to 1570 nm when either an input signal power of 0 dBm or −25 dBm is used.

Further, FIG. 6 shows exemplary first stage 210 having associated third gain values over the C-band range, for example, which are greater than the first gain values of the second stage 220 discussed above. In addition, the first stage 210 having the characteristics shown in FIG. 6 has associated fourth gain values outside the C-band range, for example, which are greater than the second gain values of second stage 220 associated with wavelengths outside the C-band range.

Figure 7:
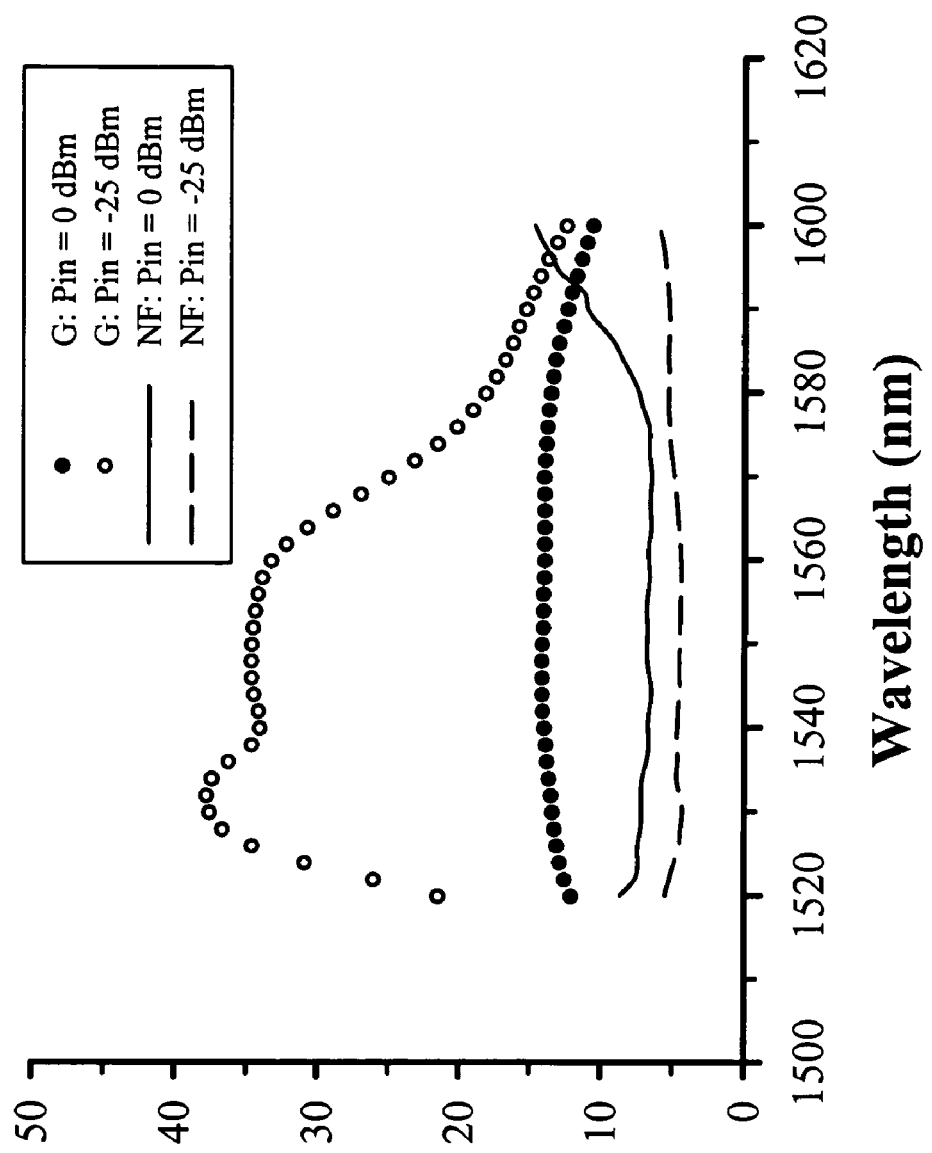
FIG. 7 illustrates a graph of a gain and noise figure spectra of a broadband hybrid two-stage amplifier system with a 10 meter long erbium doped fiber over a spectral range of 1520 to 1600 nm for 0 and −25 dBm input signal powers, consistent with an embodiment of the present invention.

FIG. 7 illustrates the gain and noise figure profiles of broadband hybrid two-stage amplifier system 140 comprising a first stage 210 including a 10 m long erbium doped fiber 214 and a second stage 220. The gain and noise figure profiles of the hybrid amplifier 140 for the input signal power Pin=0 and −25 dBm within the wavelength range of 1520 to 1600 nm is illustrated in FIG. 7. As illustrated, the gain and noise figure of the hybrid amplifier 140 are improved within the C-band, however, the effective operating range remains relatively narrow.

As further illustrated in FIG. 7, a gain of 14.1 dB at a wavelength of 1548 nm is obtained when the input power is 0 dBm. However, a peak gain of 37.7 dB and noise figure of 4.6 dB are obtained at a wavelength of 1532 nm when the input signal power is −25 dBm. In addition, within the operating wavelength range of 1520 to 1600 nm the noise figure ranged from 6.3 to 14.8 dB at an input signal power of Pin=0 and ranged from 4.4 to 5.9 dB at an input signal power of Pin=−25 dBm. Moreover, FIG. 7 shows exemplary amplifier 140 having associated fifth gain values over the C-band range, for example, which are greater than the first gain values of the second stage 220 and the third gain values of the first stage 210. In addition, the exemplary amplifier 140 has associated sixth gain values associated with wavelengths outside the C-band range, for example, which are greater than the second gain values of the second stage 220 and the fourth gain values of the first stage 210. As discussed below, these obtained results may be improved by reducing the length of erbium doped fiber 214.

Figure 8:
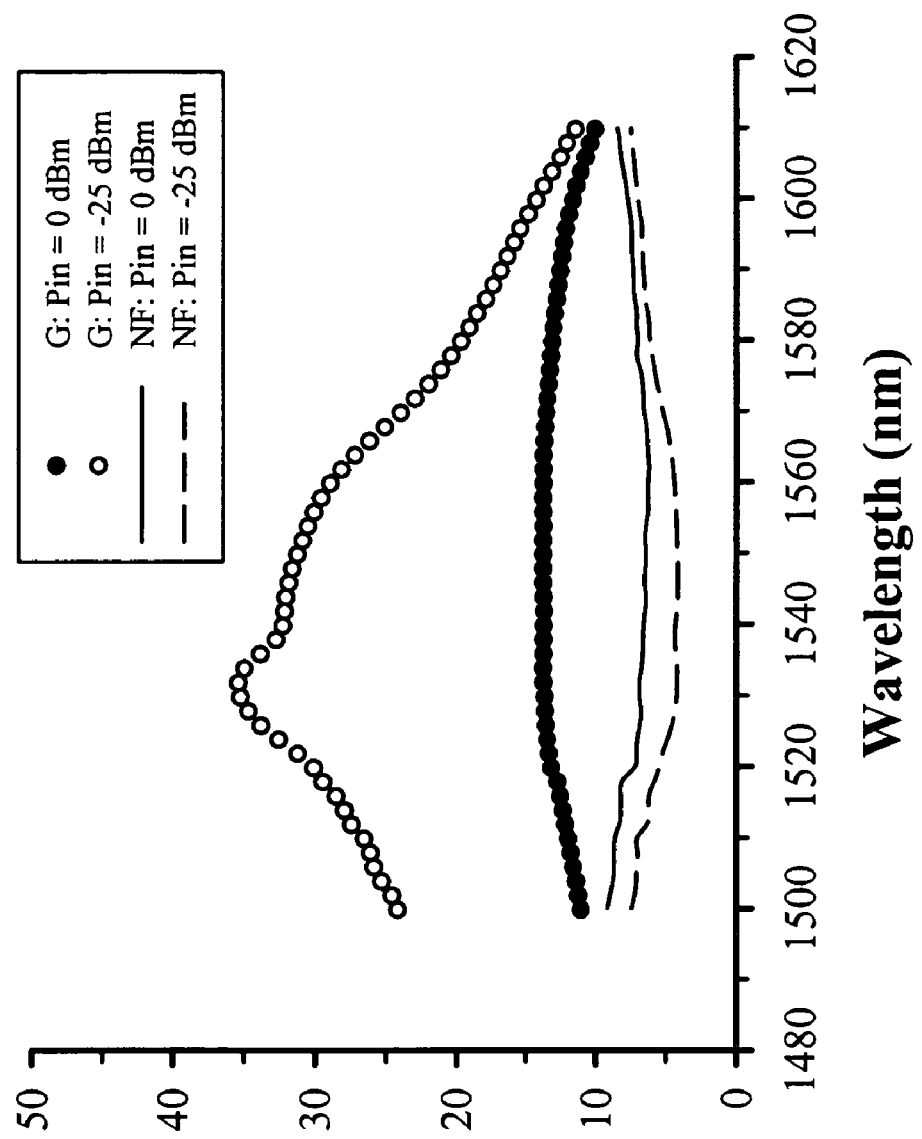
FIG. 8 illustrates a graph of a gain and noise figure spectra of a broadband hybrid two-stage amplifier system with a 3 m long erbium doped fiber over a spectral range of 1520 to 1600 nm for 0 and −25 dBm input signal powers, consistent with an embodiment of the present invention.

FIG. 8 illustrates the gain and noise figure ("second noise figure") of broadband hybrid two-stage amplifier system 140 including a first stage 210 having a 3 m long erbium doped fiber 214 operating with a 40 mW pumping power and a second stage 220. Here, amplifier 140 receives signals having wavelengths over a range of 1500 to 1610 nm at input signal powers of 0 and −25 dBm. FIG. 8 also illustrates that a gain of 13.7 dB at a wavelength of 1558 nm is obtained when the input signal power is 0 dBm, and a maximum gain of 35.3 dB (4.3 dB noise figure) at 1532 nm is obtained when the input signal power is −25 dBm. As a result, adequate gain can be obtained over a wavelength range of 110 nm (i.e., between 1500 nm and 1610 nm).

This amplification system 140 not only enhances the gain value, but also has an extended operating bandwidth from 1500 to 1610 nm (S- to L-bands). As a result, hybrid two-stage amplifier 140 advantageously has a simple architecture, 110 nm broadband amplification region, higher gain, and lower noise figure. Moreover, not only are the fifth gain values of the amplifier 140, which are associated within an exemplary wavelength range (e.g., the C-band range), greater than the first and third gain values of respective first stage 210 and second stage 220 over the same exemplary wavelength range, but the sixth gain values associated with wavelengths outside the exemplary wavelength range are also greater than the second and fourth gain values of respective first stage 210 and second stage 220 outside the same wavelength range.

Further advantages consistent with the present invention will next be described with reference to FIG. 9, which illustrates a bit error rate (BER) test results associated with an exemplary amplifier consistent with the present invention. As generally understood, a BER test can be used to determine to what extent a particular component may introduce errors in an optical transmission system.

Figure 9:
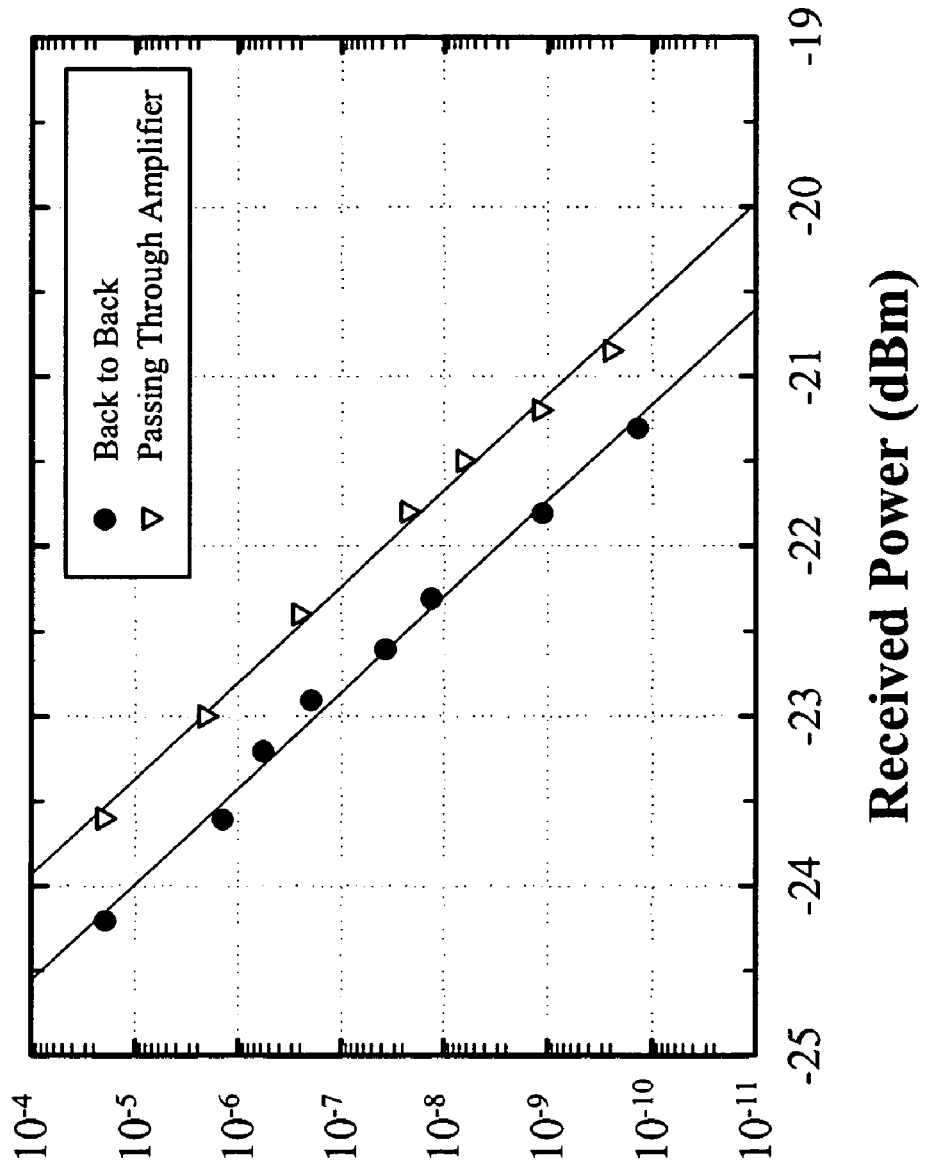
FIG. 9 illustrates a graph of the performance of a bit error rate at a test signal of 1552 nm in 2.5 Gb/s modulated system in a back-to-back type configuration and with a hybrid two-stage amplifier system, which is consistent with an embodiment of the present invention.

In the BER test yielding the results shown in FIG. 9, a test input signal having a wavelength of 1552 nm was modulated in accordance with a 2.5 Gb/s non-return-to-zero pseudo random binary sequence having a pattern length of $2^{31}-1$. The signal was modulated with a LiNbO3 electro optical modulator. In addition, a 2.5 Gb/s optical receiver was used to detect the transmitted signal. In FIG. 9, the BER of a back-to-back configuration, including only a transmitter and receiver, is plotted along with a BER of a configuration including an exemplary amplifier 140 consistent with the present invention provided between the transmitter and receiver. As is evident from the test results, while a test input signal passes through the amplifier 140, the observed optical power penalty is about 0.6 dB.

In summary, a broadband hybrid two-stage optical amplifier 140 comprising a first stage 210 and a second stage 220 that are optically connected in series is disclosed. The disclosed amplifier 140 is capable of increasing the amplification gain value of an optical signal, as well as enhancing the effective amplification bandwidth. In particular, within an amplification bandwidth of 1500 to 1610 nm operational data disclosed herein demonstrate that at an input signal power of 0 dBm, the amplification gain can be up to 13.7 db at a wavelength of 1558. Moreover, at an input signal power of −25 dB, a peak gain of 35.3 dB and a noise figure of 4.3 dB are observed at the wavelength 1532 nm.

The foregoing description has been presented for purposes of illustration. It is not exhaustive and does not limit the invention to the precise forms or embodiments disclosed. Modifications and adaptations of the invention will be apparent to those skilled in the art from consideration of the specification and practice of the disclosed embodiments of the invention. For example, although erbium has been described as the fluorescent material of the gain medium in fiber 214, it is understood that other fluorescent materials and corresponding different pump wavelengths may also be employed, including, for example, other rare earth elements.

Moreover, while illustrative embodiments of the invention have been described herein, the scope of the invention includes any and all embodiments having equivalent elements, modifications, omissions, combinations (e.g., of aspects across various embodiments), adaptations and/or alterations as would be appreciated by those in the art based on the present disclosure. The limitations in the claims are to be interpreted broadly based on the language employed in the claims and not limited to examples described in the present specification or during the prosecution of the application, which examples are to be construed as non-exclusive. It is intended, therefore, that the specification and examples be considered as exemplary only, with a true scope and spirit of the invention being indicated by the following claims and their full scope of equivalents.

What is claimed is:

1. An optical amplifier, comprising:
    an optical fiber including a core doped with fluorescent material;
    a first optical isolator coupled to an input portion of the optical fiber for preventing return reflections into the optical fiber;
    a second optical isolator coupled to an output portion of the optical fiber; and
    a semiconductor optical amplifier portion coupled to the optical fiber via the second optical isolator, the semiconductor optical amplifier portion having an associated first noise figure;
    wherein the optical amplifier has an associated second noise figure, the second noise figure being less than the first noise figure, and wherein the optical fiber and the semiconductor optical amplifier portion are configured such that the optical amplifier has an amplification bandwidth that encompasses a wavelength range of 1500 nm to 1610 nm.

2. An optical amplifier in accordance with claim 1, wherein the semiconductor optical amplifier portion being configured to impart first gain values within a first wavelength range, and second gain values outside the first wavelength range,
    the optical fiber is configured to impart third gain values within the first wavelength range, and fourth gain values outside the first wavelength range, and
    wherein the optical amplifier is configured to impart fifth gain values within the first wavelength range, each of the fifth gain values being greater than each of the first gain values and the third gain values.

3. An optical amplifier in accordance with claim 2, wherein the optical amplifier is configured to impart sixth gain values outside the first wavelength range, each of the sixth gain values being greater than each of the second and fourth gain values.

4. An optical amplifier in accordance with claim 3, wherein the first wavelength range is between 1525 nm and 1565 nm.

5. An optical amplifier in accordance with claim 1, further comprising:
    a coupler configured to combine an input optical signal and a pump light onto a first optical communication path portion, the first optical communication path portion being coupled to the optical fiber.

6. An optical amplifier in accordance with claim 1, wherein the optical fiber is 3 m long.

7. An optical amplifier in accordance with claim 1, wherein the optical amplifier is configured to receive an input optical signal and supply an output optical signal in response to the input optical signal, wherein when the input optical signal has an optical power of −25 dBm, an amount of maximum gain associated with the optical amplifier is at least 35.3 dB, and a corresponding noise figure is equal to 4.3 dB.

8. An optical amplifier in accordance with claim 1, wherein an input signal to the optical amplifier is supplied to the optical fiber and an output signal of the optical amplifier is supplied from the semiconductor optical amplifier portion.

9. A wavelength division multiplexing transmission system, comprising:
- a plurality of transmitters each of the plurality of transmitters being configured to transmit a respective one of a plurality of optical signals, wherein each of the plurality of optical signals is at a respective one of a plurality of wavelengths;
- a multiplexer configured to combine the plurality of optical signals onto an optical communication path;
- an optical amplifier comprising:
  - an optical fiber including a core doped with fluorescent material;
  - a first optical isolator coupled to an input portion of the optical fiber for preventing return reflections into the optical fiber;
  - a second optical isolator coupled to an output portion of the optical fiber; and
  - a semiconductor optical amplifier portion coupled to the optical fiber via the second optical isolator, the semiconductor optical amplifier portion having an associated first noise figure;
  - wherein the optical amplifier has an associated second noise figure, the second noise figure being less than the first noise figure, and wherein the optical fiber and the semiconductor optical amplifier portion are configured such that the optical amplifier has an amplification bandwidth that encompasses a wavelength range of 1500 nm to 1610 nm;
- a demultiplexer configured to separate each of the plurality of optical signals based on their respective wavelength; and
- a plurality of receivers configured to receive the separated optical signals and convert the optical signals into corresponding electrical signals.

10. A wavelength division multiplexing transmission system in accordance with claim 9, wherein the semiconductor optical amplifier portion being configured to impart first gain values within a first wavelength range, and second gain values outside the first wavelength range,
- the optical fiber is configured to impart third gain values within the first wavelength range, and fourth gain values outside the first wavelength range, and
- wherein the optical amplifier is configured to impart fifth gain values within the first wavelength range, each of the fifth gain values being greater than each of the first gain values and the third gain values.

11. A wavelength division multiplexing transmission system in accordance with claim 10, wherein the optical amplifier is configured to impart sixth gain values outside the first wavelength range, each of the sixth gain values being greater than each of the second and fourth gain values.

12. A wavelength division multiplexing transmission system in accordance with claim 11, wherein the first wavelength range is between 1525 nm and 1565 nm.

13. A wavelength division multiplexing transmission system in accordance with claim 9, further comprising:
- a coupler configured to combine an input optical signal and a pump light onto a first optical communication path portion, the first optical communication path portion being coupled to the optical fiber.

14. A wavelength division multiplexing transmission system in accordance with claim 9, wherein the optical fiber is 3 m long.

15. A wavelength division multiplexing transmission system in accordance with claim 9, wherein the optical amplifier is configured to receive an input optical signal and supply an output optical signal in response to the input optical signal, wherein when the input optical signal has an optical power of −25 dBm, an amount of maximum gain associated with the optical amplifier is at least 35.3 dB, and a corresponding noise figure is equal to 4.3 dB.

16. A wavelength division multiplexing transmission system in accordance with claim 9, wherein an input signal to the optical amplifier is supplied to the optical fiber and an output signal of the optical amplifier is supplied from the semiconductor optical amplifier portion.

17. An optical amplifier, comprising:
- a semiconductor optical amplifier portion configured to impart first gain values within a first wavelength range, and second gain values outside the first wavelength range;
- an optical fiber coupled to the semiconductor optical amplifier portion and including a core doped with a fluorescent material, the optical fiber being configured to impart third gain values within the first wavelength range, and fourth gain values outside the first wavelength range;
- a first optical isolator coupled to an input portion of the optical fiber for preventing return reflections into the optical fiber; and
- a second optical isolator coupled to an output portion of the optical fiber and the semiconductor optical amplifier portion;
- wherein the optical amplifier is configured to impart fifth gain values within the first wavelength range, each of the fifth gain values being greater than each of the first gain values and the third gain values, and
- wherein the optical fiber and the semiconductor optical amplifier portion are configured such that the optical amplifier has an amplification bandwidth that encompasses a wavelength range of 1500 nm to 1610 nm.

* * * * *